United States Patent
Toh

(10) Patent No.: US 6,639,144 B1
(45) Date of Patent: Oct. 28, 2003

(54) ELECTROMAGNETIC INTERFERENCE REDUCTION SYSTEM

(75) Inventor: Tze-Chuen Toh, Vermillion, SD (US)

(73) Assignee: Gateway, Inc., N. Sioux City, SD (US)

( * ) Notice: Subject to any disclaimer, the term of this patent is extended or adjusted under 35 U.S.C. 154(b) by 43 days.

(21) Appl. No.: 09/945,078

(22) Filed: Aug. 31, 2001

(51) Int. Cl.[7] .............................................. H01B 5/00
(52) U.S. Cl. ...................... 174/35 R; 361/816; 361/818
(58) Field of Search ................. 174/35 R, 36; 361/816, 818

(56) References Cited

U.S. PATENT DOCUMENTS

| | | | |
|---|---|---|---|
| 3,809,233 A | * 5/1974 | Gruszka ..................... 206/722 |
| 4,114,036 A | * 9/1978 | Tsunekawa et al. ..... 250/214 R |
| 4,698,197 A | * 10/1987 | Kerns et al. ................. 376/142 |
| 5,165,985 A | 11/1992 | Wiste et al. ................. 428/209 |
| 5,191,544 A | 3/1993 | Benck et al. ................. 364/708 |
| 5,420,760 A | 5/1995 | Ansell et al. ................ 361/818 |
| 5,639,989 A | 6/1997 | Higgins, III ........... 174/35 MS |
| 5,646,820 A | * 7/1997 | Honda et al. ................ 361/683 |
| 5,680,297 A | 10/1997 | Price et al. .................. 361/818 |
| 5,684,271 A | 11/1997 | Scholder et al. .......... 174/35 R |
| 5,691,504 A | 11/1997 | Sands et al. ............... 174/35 R |
| 5,707,715 A | 1/1998 | deRochemont et al. ..... 428/210 |
| 5,811,050 A | 9/1998 | Gabower ..................... 264/299 |
| 5,814,761 A | * 9/1998 | Piazza ...................... 174/35 R |
| 5,821,453 A | 10/1998 | Epstein et al. .......... 174/35 MS |
| 5,822,182 A | 10/1998 | Scholder et al. ............. 361/683 |
| 5,822,195 A | 10/1998 | Brench et al. ............... 361/818 |
| 5,823,795 A | 10/1998 | Schumacher ............... 439/76.1 |
| 5,966,294 A | 10/1999 | Harada et al. ............... 361/794 |
| 6,070,506 A | * 6/2000 | Becker ......................... 81/479 |
| 6,090,728 A | 7/2000 | Yenni, Jr. et al. ........... 442/117 |
| 6,163,454 A | 12/2000 | Strickler ..................... 361/695 |
| 6,211,457 B1 | 4/2001 | Cama et al. .............. 174/35 C |
| 6,347,997 B1 | * 2/2002 | Armstrong ................... 463/37 |
| 6,476,463 B1 | * 11/2002 | Kaneko et al. ............. 257/660 |

FOREIGN PATENT DOCUMENTS

| | | |
|---|---|---|
| EP | 0880311 A1 | 11/1998 |
| JP | 8186396 | 7/1996 |
| JP | 2001230121 | 8/2001 |

* cited by examiner

Primary Examiner—Dean A. Reichard
Assistant Examiner—Jinhee Lee

(57) ABSTRACT

A system and method incorporate one or more magnets affixed in proximity to a ground plane of a printed circuit board such that the magnetic flux of the magnet is operable to perturb current flow through the ground plane, resulting in a reduction in electromagnetic emissions. The invention is implemented with various types of magnets in different embodiments, including rare-earth magnets, AlNiCo magnets, Neodymium magnets, and flat-sheet magnets. A digital electronic device consistent with the present invention incorporates one or more magnets in proximity to a ground plane of a circuit board within the device, such devices including computers, set-top boxes, and personal digital assistants in various embodiments.

24 Claims, 2 Drawing Sheets

ELECTROMAGNETIC INTERFERENCE REDUCTION SYSTEM

FIELD OF THE INVENTION

The invention relates generally to electromagnetic interference, and more specifically to a system for reducing magnetic interference propagated from an electronic device such as a personal computer.

BACKGROUND OF THE INVENTION

Modern electronic devices that rely upon computerized circuits or digital logic typically conduct voltage signals within the circuits that change at very fast rates. Because digital logic is usually implemented in terms of ones and zeros, with ones being represented by some positive voltage such as 5 v or 3.3 v, and zeros being represented by zero voltage, such circuits must quickly change state from a positive voltage to zero voltage millions or billions of times per second to provide the capability to quickly calculate or process information.

These rapid changes in voltage state within such circuits can be viewed over time as approximating what is known as a square wave, wherein the voltage changes between states almost instantaneously. In practice, all circuits have limited bandwidth, and so a perfect square wave is not achieved. But, the approximate square wave that appears in most digital logic circuits changes state more quickly with faster circuits and switching times, and contains higher frequency components as it changes state more quickly.

These high frequency components can be easily radiated as electromagnetic fields from the electronic circuit, especially when the wavelength of the high frequency components is short enough to become a significant fraction of the conductive traces or wires that connect the circuit components to each other, which then become effective antennas. Digital signals are rich in spectral content, often containing significant energy over a wide bandwidth of the radio spectrum. These signals must be shielded to reduce emissions to certain levels before a digital electronic product can be sold according to requirements imposed by most countries, and so must be understood and controlled in the design process.

The high frequency currents that contribute to electromagnetic radiation from circuits will tend to travel through a circuit along a path of lowest inductance, which is as a practical matter the path of lowest overall impedance. The overall path typically includes various circuit traces on one or more layers of a printed circuit board, and conduction back to a ground potential through a relatively uniform ground plane layer of the circuit board. The loop formed by the circuit path contributes to both electrical and magnetic radiation, and is proportional to the current conducted through the loop.

What is desired is a system and method for reducing the electromagnetic emissions radiated from a digital electronic device.

SUMMARY OF THE INVENTION

The present invention provides a system and method incorporating one or more magnets affixed in proximity to a ground plane of a printed circuit board such that the magnetic flux of the magnet is operable to perturb current flow through the ground plane, resulting in a reduction in electromagnetic emissions. The invention is implemented with various types of magnets in different embodiments, including rare-earth magnets, AlNiCo magnets, Neodymium magnets, and flat-sheet magnets. A digital electronic device consistent with the present invention incorporates one or more magnets in proximity to a ground plane of a circuit board within the device, such devices including computers, set-top boxes, and personal digital assistants in various embodiments.

DETAILED DESCRIPTION

Figure 1:
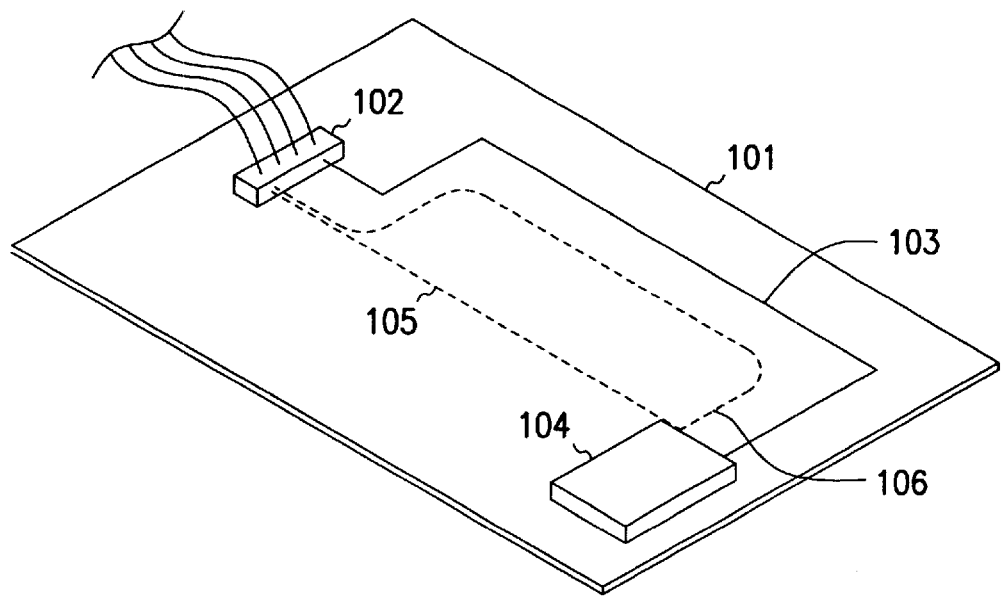
FIG. 1 shows a printed circuit board and current flow through a ground plane, consistent with the prior art.

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides a system and method for reducing the electromagnetic emissions radiated from a digital electronic device by implementing one or more magnets to perturb the signal path through a ground plane and thereby reduce loop current and radiated electromagnetic emissions. The magnetic flux of the one or more magnets is operable to perturb current flow through the ground plane, resulting in a reduction in electromagnetic emissions. The invention is implemented with various types of magnets in different embodiments, including rare-earth magnets, AlNiCo magnets, Neodymium magnets, and flat-sheet magnets.

The invention is implemented in some embodiments as a digital electronic device incorporating one or more magnets in proximity to a ground plane of a circuit board within the device, such devices including computers, set-top boxes, and personal digital assistants. The magnets are placed close enough to the ground plane of the digital electronic device so that the magnetic flux of the magnets is operable to change the path of current flow through the ground plane.

Subjecting the ground plane of a system board in such an electronic device to a uniform magnetic field of certain predetermined density reduces the amount of high frequency electromagnetic emissions resulting from the formation of ground current loops. First, high frequency currents travel approximately along the path of least inductance, since this is essentially the path of least impedance. Hence, subjecting the (classical) mean path of an oscillating current to any degree of perturbation would imply immediately that the new perturbed (mean) path for current flow is one of a higher inductance. This translates to a lower current flowing along the perturbed mean path, and hence, a lower electromagnetic emission.

1. Theory

A brief theory is first outlined here, followed by a theoretical model yielding a quantitative comparison between the electromagnetic emissions of a system board subjected to a specified magnetic field density normal to the ground plane and that of the control system board. The control system board is the board without the applied magnetic field density.

The ground plane of a typical system board is not perfect; because it has a finite impedance, it is not a perfectly equipotential plane. There is a minor fluctuation in potential between points on the ground plane. Furthermore, its finite nontrivial impedance means that high frequency currents flowing along the ground plane will cause a potential drop along the mean paths that they traverse along the ground plane.

The actual electric field on the ground plane depends on how the circuits are laid out on the board and where the connectors to the main power supply reside. The potential $\phi$ defined on the ground plane must satisfy Laplace's equation:

$$\nabla^2 \phi = 0, \tag{1.1}$$

subject to the boundary conditions imposed by the board and its lay out. By definition, a harmonic function is any function that satisfies the Laplace's equation. The theory of partial differential equations provides that a harmonic function attains its minimum and maximum values on the boundary of the domain of definition. Therefore, the minimum and maximum of $\phi$ defined on the ground plane must lie only on the edges of the board, or on the metal plates around the holes lying on the board that hold the board to the chassis. For purposes of this analysis, it is assumed therefore that the minimum and maximum values are attained on the edges of the board. This means that the minimum and maximum points on the board would most probably lie on the opposite edges. Indeed, in a purely static situation, the minimum and maximum values would be diametrically opposite to one another.

Now, suppose that the ground plane—typically made of a sheet of copper—has a uniform inductance per unit length $\tilde{L}$; that is, the inductance per unit length between any two points on the ground plane is $\tilde{L}$. The presence of a non-trivial potential function on the ground plane means that there exists an electric field $E_0$ defined everywhere on the ground plane G. Hence, from the uniqueness theorem of ordinary differential equations, the vector field $E_0$ generates a unique path between any two points in G. This is the mean current path for very low frequency currents. For high frequency currents, the mean paths would essentially be straight lines between points, as that is the path of the least inductance.

By applying a magnetic field density B normal to G, the electrons will experience a Lorentz force induced by the magnetic field, pushing them perpendicular to their direction of motion. For low frequency currents running through the ground plane, their paths will essentially be dictated by the paths defined by the vector field $E_0 - v \times B$, where $v$ is the mean velocity of the electrons. Since the paths generated by $E_0$ define the shortest mean paths for low frequency currents, the paths generated by $E_0 - v \times B$ are those of higher impedances. Hence, there is an overall decrease in (low frequency) current on the ground plane as a result of the applied magnetic field density.

Similarly, for high frequency currents propagating on the ground plane, any deviation along its original path $\gamma$ would imply that the current is forced to propagate along a path $\gamma$ of a higher inductance. This follows simply from the fact that the flow of electrons will curve away from their original path due to the Lorentz force acting normal to their velocity. Hence, the current flowing along $\gamma$ must decrease. This will become clear shortly below. In all that follows, the term current will mean a current oscillating at some frequency $f$. That the frequency of the current is non-zero will be assumed implicitly throughout the paper.

Observe from the continuity of the potential function $\phi$ that the plane G can be partitioned by a family of parametrised curves $\{\rho_\alpha\}$ defined on the closed interval [0, 1] such that (i) for each value of $\phi(x)$, for any point x in G, there exists a unique curve $\rho_\alpha$ such that $\rho_\alpha(\bar{t}) = x$ for some $0 \leq \bar{t} \leq 1$, and $\phi(\rho_\alpha(t)) = \phi(x)$ for all $0 \leq t \leq 1$—that is, $\rho_\alpha$ is an equipotential curve for each $\alpha$;

(ii) the ground plane is the union of the family of curves $\{\rho_\alpha\}$:

$$G = Y_\alpha \{\rho_\alpha(t) | 0 \leq t \leq 1\}.$$

The definition of a parameterised curve $\rho_\alpha$ in G is a continuous function mapping the unit interval [0, 1] into G.

Next, consider two distinct circuits A and B on the system board and suppose that the ground of A is connected to a point p in G and the ground of B is connected to a point q in G, where p and q are two distinct points. Suppose further that a current oscillating at some frequency $f$ exists between A and B and forming a loop via the ground plane along the path $\gamma_{pq}$ that connects p and q: $\gamma_{pq}(0) = P$, $\gamma_{pq}(1) = q$.

Let $\rho_\alpha$ be a curve of constant potential $\phi(q)$, and suppose that $\gamma_{pq}(1) = q = \rho_\alpha(c)$ for some $0 < c < 1$. By applying a magnetic field density B perpendicular to G, the original path $\gamma_{pq}$ will be transformed to a new path $\gamma_{pq'}$ that curves away from $\gamma_{pq}$, where $\gamma_{pq}(0) = \gamma_{pq'}(0)$, due to the Lorentz force. Suppose that the path $\gamma_{pq'}$ terminates at some point $q' = \rho_\alpha(c')$, for some $c < c' \leq 1$. By construction, $|\gamma_{pq'}| > |\gamma_{pq}|$, where $|\gamma_{pq}|$ denotes the length of $\gamma_{pq}$ in G. So, if $(i_0, \gamma_{pq})$ denotes the mean current flowing along the mean path $\gamma_{pq}$, then, by construction, $i_0 \omega \tilde{L}|\gamma_{pq}| = \phi(q) = i \omega \tilde{L}|\gamma_{pq'}|$ and hence the current $(i, \gamma_{pq'})$ is given by $i = i_0 |\gamma_{pq}|/|\gamma_{pq'}| \equiv i_0 \beta$, where $\beta = |\gamma_{pq}|/|\gamma_{pq'}|$. In particular, the loop is broken into an open curve with a decrease in overall conduction current that is smaller than $i_0$ by a factor of $|\gamma_{pq}|/|\gamma_{pq'}|$. That the curve is no longer closed follows simply from the fact that $\gamma_{pq}$ and $\gamma_{pq'}$ both terminate on different points on the same equipotential path. By definition, this means that there is no current flow between the two points on $\rho_\alpha$.

Note that there exists a value $B_0$ such that for any applied magnetic field $B > B_0$ normal to G, the new perturbed path $\gamma_{pq'}$ will not intersect the equipotential curve $\rho_\alpha$. That $\gamma_{pq'}$ will not intersect $\rho_\alpha$ follows clearly from the finiteness of the ground plane. Hence, there is now either an open circuit on the ground plane if $\gamma_{pq'}$ terminates along some equipotential curve $\rho$, where $\phi(\rho(t)) = \phi(\gamma_{pq}(1)) \leq \phi(\gamma_{pq}(0))$ for $0 \leq t \leq 1$, or a smaller current flowing through the path $\gamma_{pq'}$ if it terminates at some equipotential curve $\rho'$ such that $\phi(\gamma_{pq}(0)) < \phi(\rho'(t)) = \phi(\gamma_{pq}(1)) < \phi(\gamma_{pq}(1))$ for $0 \leq t \leq 1$.

In the analysis to follow, for simplicity, all loops considered are be taken to be rectangular loops of area $ax^2$ and perimeter $2(1+a)x$, where x is bounded by the length of the ground plane and ax is bounded by the width of the ground plane with $a \geq 0$. It is known that the total power $P_E$ radiated by a Hertzian dipole of length $2(1+a)x$, where the wavelength of the electromagnetic waves is $\lambda$, is given by $$P_E = \tfrac{2}{3} c\pi^2 I^2 (1+a)^2 (x/\lambda)^2, \tag{1.2}$$

c denotes the speed of light and I is the current flowing along the Hertzian dipole. The total power radiated from a magnetic dipole of area $ax^2$ is given by $$P_M = \frac{1}{3} c \left(\frac{2\pi}{\lambda}\right)^4 a^2 x^4 I^2. \tag{1.3}$$

Let $\gamma$ denote a current loop such that $\gamma_{pq}$ is a portion of $\gamma$ that runs along the ground plane. Then, in all that follows, for notational convenience, the path $\gamma_{pq}$ and its associated loop $\gamma$ will be used interchangeably should no ambiguity arise. So, given $(i_0, \gamma_{pq})$ when the applied (normal) magnetic field strength $B=0$ and it corresponding perturbed current and path $(i_0\beta, \gamma_{pq'})$ when $B \leq B_0$, it follows from equations (2.2) and (2.3) that $$P_E(\gamma_{pq'}) = \tfrac{1}{6} c i_0^2 \beta^2 (1+^{1+i}/_3)^2 a_M^2, \tag{2.4}$$

$$P_M(\gamma_{pq}) = \tfrac{1}{3} c i_0^2 a^2 a_M^4. \tag{2.5}$$

So, together, equations (2.4) and (2.5) yield $$\frac{P_E(\tilde\gamma)}{P_M(\gamma)} = \frac{1}{8\pi^2} \beta^2 \left(1+\frac{1}{a}\right)^2 \left(\frac{\lambda}{x}\right)^2, \tag{2.6}$$

where, recall that $0<\beta<1$ and $a>0$.

Now, $$\frac{P_E(\tilde\gamma)}{P_M(\gamma)} < 1 \Rightarrow a > \frac{\lambda\beta}{2\sqrt{2}\,\pi x - \lambda\beta}.$$

This means that $2\sqrt{2}\pi x > \lambda\beta$ for any $0<\beta<1$. Hence, set $$x_\lambda = \frac{\lambda}{2\sqrt{2}\,\pi}.$$

Then, $$\frac{P_E(\tilde\gamma)}{P_M(\gamma)} < 1$$

implies that $x = a_M x_\lambda$, where $a_M > 1$. The subscript "M" denotes magnetic (dipole). Furthermore, let $y_{max}$ denote the maximal width of the ground plane and $x_{max}$ denotes the maximal length of the ground plane. Then, from $ax \leq y_{max}$, the bounds for a can be shown with little effort to be:

$$\frac{\beta}{a_M - \beta} < a \leq \frac{y_{max}}{x_\lambda} \frac{1}{a_M}. \tag{2.7}$$

In particular, it follows from the inequality that $$a \leq \frac{\beta}{a_M - \beta}$$

implies that $$\frac{P_E(\tilde\gamma)}{P_M(\gamma)} \geq 1.$$

That is, for a rectangular magnetic dipole antenna of perimeter $\epsilon$, where $\epsilon$ is small, the power radiated from the magnetic dipole is less than that of an Hertzian dipole of length $\epsilon$.

Next, consider the case where $B > B_0$. It will suffice to investigate the case where $\gamma pq'$ terminates at some equipotential curve $\rho_\alpha$ at $q' = \rho_\alpha(c')$ for some $0 < c' < 1$, where $\phi(p) < \phi(q') < \phi(q)$. Then, the perturbed current $(i, \gamma_{pq'})$ resulting from the applied magnetic field will be smaller than the case where $B \leq B_0$ by a factor of $$\frac{\phi(q')}{\phi(q)}.$$

To see this, it is enough to observe that $i = \phi(q')/\omega \tilde{L} |\gamma_{pq'}|$ and $i_0 = \phi(q)/\omega L |\gamma_{pq'}|$. Hence, $$i = i_0 \frac{\phi(q')}{\phi(q)} \frac{|\gamma|}{|\tilde\gamma|} \equiv i_0 \frac{\phi(q')}{\phi(q)} \beta < i_0 \beta,$$

as asserted.

In particular, from equation (2.4), it follows at once that $P_E(\gamma_{pq'}) \leq \tfrac{1}{6} c i_0^2 \beta^2 (1+\tfrac{1}{3})^2 a_m^2$ and hence, from equation (2.6) that $$\frac{P_E(\tilde\gamma)}{P_M(\gamma)} \leq \frac{1}{8\pi^2} \left(\beta^2 \left(1+\frac{1}{a}\right)\right)^2 \left(\frac{\lambda}{x}\right)^2.$$

Should B become too large, $\phi(q') < \phi(p)$ and hence $i \equiv 0$. That is, there will not be any current flow when the applied normal magnetic field gets too strong. In summary:

1.4. Proposition. Given any $B>0$, the current flowing through the path $\gamma_{pq'}$ in G is bounded from above by $i_0\beta$: $0 \leq i \leq i_0\beta$. In particular, for $B \gg B_0$, the circuit is essentially opened.

2.2. Proposition. Given a set $S = \{(i_{\alpha,0}, \gamma_{\alpha,pq'}): \alpha \in \Lambda\}$ of current loops, where $\Lambda$ is a non-empty indexing set labeling the loops in G when the applied magnetic field $B=0$, and let $\{(i_{\alpha,0}\beta_\alpha, \gamma_{\alpha,pq'})\}$ denote the associated perturbed paths and currents when $B>0$ is applied, where $$\tilde{B}_\alpha = \frac{\phi(q')}{\phi(q')} \frac{|\gamma_{\alpha,pq}|}{|\tilde\gamma_{\alpha,pq}|},$$

$\gamma_{\alpha,pq}(0) = \gamma_{\alpha,pq'}(0)$, $\gamma_{\alpha,pq'}(1) = q'$, $\gamma_{\alpha,pq}(1) = q$ and $q \neq q'$. Then, there exists a $\tilde{B} > 0$ such that for any $B \geq \tilde{B}$ the fraction of loops in S that satisfy $$\frac{P_E(\tilde\gamma_\alpha)}{P_M(\gamma_\alpha)} < 1$$

is greater than the fraction of loops in S that satisfy $$\frac{P_E(\tilde\gamma_\alpha)}{P_M(\gamma_\alpha)} \geq 1.$$

Proof (Sketch). From the inequality (2.7), define two semi-closed intervals $$\Delta_1 = \left(0, \frac{\beta}{a_M - \beta}\right]$$

and $$\Delta_2 = \left(\frac{\beta}{a_M - \beta}, \frac{y_{\max}}{x_\lambda} \frac{1}{a_M}\right],$$

and let $$|\Delta_1| = \frac{\beta}{a_M - \beta}$$

and $$|\Delta_2| = \frac{y_{\max}}{x_\lambda} \frac{1}{a_M} - \frac{\beta}{a_M - \beta}.$$

Now, $$\frac{P_E(\tilde{\gamma}_\alpha)}{P_M(\gamma_\alpha)} < 1$$

implies inequality (2.7). By contrapositivity, if $\alpha$ violates inequality (2.7), that is, $$a \le \frac{\beta}{a_M - \beta},$$

then $$\frac{P_E(\tilde{\gamma})}{P_M(\gamma)} \ge 1.$$

Hence, it is required to establish that $$\frac{|\Delta_2|}{|\Delta_1|} > 1$$

in order to prove the lemma.

Now, $$\frac{|\Delta_2|}{|\Delta_1|} = \frac{y_{\max}}{x_\lambda}\left(\frac{1}{\beta} - \frac{1}{a_M}\right) - 1,$$

where $a_M > 1$ and $\beta < 1$. So, in order for the inequality $$\frac{|\Delta_2|}{|\Delta_1|} > 1$$

to be satisfied, $$\frac{y_{\max}}{x_\lambda}\left(\frac{1}{\beta} - \frac{1}{a_M}\right) > 2.$$

That is, $$\beta < \frac{a_M y_{\max}}{2 x_\lambda a_M + y_{\max}}.$$

This is equivalent to $a_M$ satisfying $$a_M > \frac{y_{\max}\beta}{y_{\max} - 2x_\lambda \beta},$$

which, in turn, implies that $y_{max} > 2x_\lambda \beta$. That is, $$0 < \beta < \frac{y_{\max}}{2x_\lambda}.$$

Next, recall from above that there exists an applied normal magnetic field $B_0 > 0$ such that for all $B > B_0$, $\gamma_\alpha$ will not terminate at a point along an equipotential curve $\rho_\alpha$ upon which $\tilde{\gamma}_\alpha$ terminates (proposition 2.1). From this, it follows that there is a $\tilde{B} > 0$ such that $$\beta < \min\left(\frac{a_M y_{\max}}{2x_\lambda a_M + y_{\max}}, 1\right)$$

always holds. In particular, for any $B \ge \tilde{B}$, $$\beta < \frac{a_M y_{\max}}{2 x_\lambda a_M + y_{\max}},$$

and the lemma is thus established.

In simple terms, $$\frac{P_E(\tilde{\gamma}_a)}{P_M(\gamma_a)} \ge 1$$

means that the electric dipole type radiation is the dominant radiation whilst $$\frac{P_E(\tilde{\gamma}_a)}{P_M(\gamma_a)} < 1$$

means that the magnetic dipole radiation is the dominant field. Hence, the proposition states that there is a magnetic field strength $\tilde{B} > 0$ such that for a given radiation wavelength $\lambda$ and a given dimension ($x_{max}$, $y_{max}$) for the ground plane, it is possible for the condition $$\frac{P_E(\tilde{\gamma}_a)}{P_M(\gamma_a)} < 1$$

to prevail. And moreover, the number of radiation antennas (current loops) that satisfy the condition $$\frac{P_E(\tilde{\gamma}_a)}{P_M(\gamma_a)} < 1$$

is larger than the antennas that satisfy the relation $$\frac{P_E(\tilde{\gamma}_a)}{P_M(\gamma_a)} \geq 1.$$

In other words, there is a $\tilde{B} > 0$ that will render the Hertzian dipole radiation source to be weaker than the equivalent magnetic dipole radiation. This means that converting the magnetic dipole sources into electric dipole sources via the action of the magnetic field (to break the loops apart) results in a decrease in the total radiated power.

Current loops that lie completely in the ground plane will be broken up into open paths by the Lorentz action of the magnetic field. Current loops that lie completely in the ground plane are a special case of the current loops (considered in the analyses throughout the present section) that run partially along the ground plane. For the sake of continuity and the ease of readability, the contents of this section are encapsulated in part in the following theorem:

2.3. Theorem. Applying a static magnetic field normal to the ground plane breaks up closed current loops that lie partially in the ground plane. This results in a significant reduction in electromagnetic emissions arising from magnetic dipole radiation by (a) transforming magnetic dipole radiation into a weaker Hertzian dipole radiation;

(b) reducing the current flow that contributes to the Hertzian dipole radiation or ceasing the current flow altogether (and hence eliminating any electromagnetic radiation associated with the oscillating current).

2.4. Remark. Because closed current loops that lie completely in the ground plane are broken up by the Lorentz force acting on the loop, there is little or no electromagnetic contribution from ground current loops when a strong enough magnetic field is applied normal to the ground plane.

3. Theoretical Model.

In this last section, the theory will be illustrated by some concrete examples. First, it is clear from equation (2.6) that $$\frac{P_E(\tilde{\gamma})}{P_M(\gamma)} \to 0$$

as $\lambda \to \infty$. This has the following implication. As the wavelength of the electromagnetic radiation gets shorter, magnetic dipole antennas become a more dominant source for electromagnetic emissions even when the dimensions of the loops involved are small. This means that any departure from magnetic dipole contributions will help reduce the total amount of radiation emitted by the system. In particular, transforming magnetic dipole type emissions into electric dipole type emissions will reduce the overall electromagnetic emissions for very high frequency waves. This is particular important for the computer industries as the CPU clock frequencies continue to increase with each passing year.

For the purpose of illustration, suppose that the ground plane has the following dimensions: $x_{max} = 0.3$ m and $y_{max} = 0.2$ m. The power loss in terms of decibels will be made between $P_M(\gamma)$, when the applied magnetic field B=0, and $P_E(\gamma)$, when the applied field is non-trivial. That is, the quantity $$\Theta(\gamma, \tilde{\gamma}) = 10 \log \frac{P_E(\tilde{\gamma})}{P_M(\gamma)}$$

will be determined for various realistic loop sizes.

In the light of remark 2.4, it will suffice to consider loops that partially lie on the ground plane. First, the results for the portion of the loops running along the ground plane that are 0.9 and 0.98 the lengths of the paths perturbed by an applied magnetic field will be examined. The results are tabulated below.

| $\Theta(\gamma, \tilde{\gamma})$ (m) | | (cm) | (cm) | | (dB) |
|---|---|---|---|---|---|
| 0.3 | 0.9 | 8.44 | 11.0 | 0.406 | −3.92 |
| 0.3 | 0.9 | 6.75 | 6.75 | 0.81 | −0.92 |
| 0.3 | 0.98 | 10.1 | 10.1 | 0.427 | −3.70 |
| 0.3 | 0.98 | 8.44 | 8.44 | 0.614 | −2.11 |
| 0.2 | 0.9 | 5.63 | 5.63 | 0.518 | −2.85 |
| 0.2 | 0.9 | 4.50 | 4.50 | 0.903 | −0.45 |
| 0.2 | 0.9 | 5.63 | 8.44 | 0.36 | −4.44 |
| 0.2 | 0.98 | 5.63 | 3.94 | 0.906 | −0.43 |
| 0.2 | 0.98 | 5.63 | 5.63 | 0.615 | −2.11 |

The table above shows the typical electromagnetic reduction for an average current loop a part of which—of length x—runs along the ground plane. From the theoretical data, it can be seen that as the dimensions of the loop get smaller, the electromagnetic reduction falls off rapidly. Recall that $\beta$ is the measure of the length of the perturbed path when a magnetic field is applied perpendicular to the ground plane. The smaller $\beta$ is, the longer is the perturbed path relative to its unperturbed counterpart. The next table below shows how much electromagnetic power is reduced for various values of $\beta$. The data corresponds respectively to both loops of dimensions x=5.63 cm and y=5.63 cm at $\lambda=0.2$ m, and of dimensions x=8.44 cm and y=8.44 cm at $\lambda=0.3$ m. Note that $\lambda=0.2$ m corresponds to a frequency of 1.5 GHz while $\lambda=0.3$ m corresponds to a frequency of 1 GHz.

| $\Theta(\gamma, \tilde{\gamma})$ | | (dB) |
|---|---|---|
| 0.98 | 0.6147 | −2.11 |
| 0.9 | 0.5184 | −2.85 |
| 0.8 | 0.409 | −3.88 |
| 0.7 | 0.3136 | −5.04 |
| 0.6 | 0.2304 | −6.38 |
| 0.5 | 0.16 | −7.96 |
| 0.4 | 0.1024 | −9.90 |

The data clearly demonstrates that in order to achieve an equivalent drop in power for an electromagnetic radiation of a longer wavelength, a larger loop dimension is required. In other words, magnetic dipole antennas radiate less strongly than an electric dipole antenna for longer wavelength electromagnetic waves when the physical dimensions of the antennas involved are small. On the other hand, for large dimensions, magnetic dipole antennas are much stronger radiators than their equivalent electric dipole counterparts.

For small antenna loops, transforming them into electric dipoles mean an increase in radiated energy. Consider the case where $\lambda = 0.3$ m. On a conservative side, suppose that $\beta = 0.9$ and the dimensions of the (rectangular) loop are: x=2 cm and y=2 cm. That is, a=1 and $$a_M = \frac{x_2}{x} = 0.592.$$

Then, $$\frac{P_E(\tilde{\gamma})}{P_M(\gamma)} \leq 2.05$$

by proposition 2.1 and equation (2.6); that is, 10 log $$\frac{P_E(\tilde{\gamma})}{P_M(\gamma)} \leq 3.12 \text{ dB}.$$

Hence, applying the magnetic field actually caused a gain that may be as high as +3.12 dB of radiation. Close scrutiny shows the dimensions of the loops involved are very small. Recalling equations (2.4) and (2.5), it is clear that $P_E$ is second order in $a_M<1$ (in this case) whilst $P_M$ is fourth order in $a_M<1$. Hence, $P_E$, being approximately twice the strength of a very small quantity, is essentially a small quantity nonetheless. On the contrary, when $a_M>1$, it is easy to appreciate that $P_M$ gets rapidly much larger than $P_E$. Thus, the trade off in having a slight increase in emission for small loops is over-shadowed by the significant gain in electromagnetic reduction involved for larger loops. Furthermore, from proposition 2.2, it is clear that the trade off is fully justified (at least, from a mathematical stand point). As a concluding remark, it is always possible to choose a (static) magnetic field strength such that the currents loops flowing along the ground approaches zero. For such a value of magnetic field strength, there is virtually zero contribution of electromagnetic emissions from ground current loops.

In practice, it is then beneficial to place one or more permanent magnets having a magnetic flux selected in accordance with the above theory in proximity to a printed circuit board to reduce electromagnetic emissions resulting from ground current loops. To demonstrate this theory, FIG. 1 illustrates a printed circuit board having a mean current path dependent on the minimum impedance path through the ground plane. Printed circuit board 101 has a power supply connection at 102, from which power and ground are supplied. A trace 103 on the printed circuit board carries a supply voltage to a device such as processor 104. In steady state, return current flows from the processor through a ground plane on the printed circuit board through the path of lowest resistance, which will be approximately a straight line as represented at 105. But, when the return signal contains high frequency components, it will return through the ground plane across the path of least impedance, which in one example is represented by trace 106. Although the path 106 is longer than the path 105 and has higher resistance, the total loop area formed by paths 103 and 106 is significantly smaller, and so the loop has lower inductance than that formed by paths 103 and 105. Path 106 therefore represents the path of lowest overall impedance, which is the path that high frequency return signals will take through the ground plane.

Figure 2:
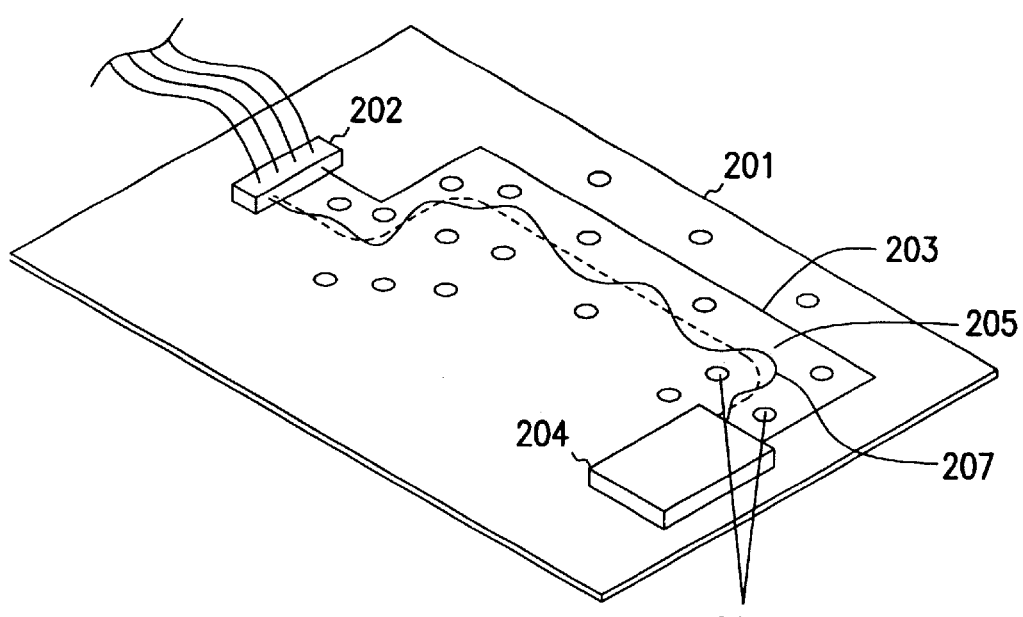
FIG. 2 shows a printed circuit board and current flow through a ground plane, consistent with an embodiment of the present invention.

FIG. 2 illustrates how the presence of one or more permanent magnets positioned in proximity to such a printed circuit board such that the magnetic flux produced by the magnets causes perturbation of the mean current path within the ground plane of the circuit board. Again, a printed circuit board 201 with a power supply connection 202 provides power via a conductive circuit board trace 203 to an integrated circuit such as processor 204. Because the power signal drawn by the processor has a significant high frequency component, the return current flows through the ground plane of the printed circuit board through the minimum impedance path 205.

Placement of one or more magnets 206 in close proximity to the circuit board perturbs the current flow through the resulting magnetic fields, causing the path to change and thereby have a higher than minimum impedance. This alternate higher impedance path 207 will by nature of its higher impedance increase the loop impedance, resulting in a reduction in loop current and therefore a reduction in electromagnetic emission. The proximity to the circuit board allows the magnetic flux from the magnet that intersects the circuit board to be relatively strong. Stronger flux causes a greater perturbation of current flow in the circuit board ground plane, and therefore can result in a greater reduction in current flow and in resulting electromagnetic emissions. Proximity is therefore dependent on the magnet flux strength, the number of magnets, the desired affect on ground plane current flow, and other such factors.

The perturbation of the return current path through the ground plane and the resulting change in return path impedance therefore is dependent on the number and configuration of magnets used, and also on the strength of the magnets and of the magnetic field they produce in proximity to the ground plane. Because stronger magnets will have a greater flux and a greater effect on the current path than weaker magnets, rare earth magnets such as alnico magnets (magnets comprising aluminum, nickel, and cobalt) or magnets comprising neodymium are well suited for some embodiments of the invention. The magnets 206 of FIG. 2 are small disc magnets affixed in close proximity to the circuit board, but other embodiments of the invention will utilize other types of permanent magnet such as flat magnets, bar magnets, or any other type of permanent magnet. Flat magnets are for purposes of this invention magnets having a thickness less than ten times their width or height, and are desirably used in some embodiments of the invention due to their relatively small thickness.

Figure 3:
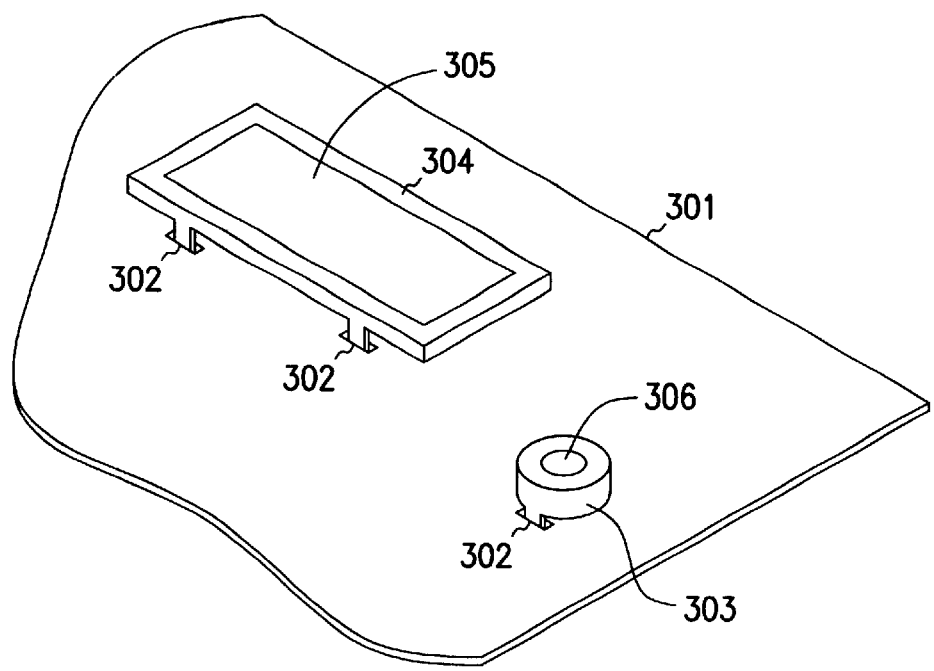
FIG. 3 shows printed circuit board assembly having permanent magnets attached to the circuit board via permanent magnet holders, consistent with an embodiment of the present invention.

FIG. 3 illustrates a printed circuit board assembly having permanent magnets attached to the circuit board via permanent magnet holders. The printed circuit board 301 has a plurality of slots or holes 302 through which tabs of magnet holders 303 and 304 are forced to attach the holders to the printed circuit board. Holder 303 is cylindrical in shape, and is operable to capture and hold a disc or cylindrical magnet 306 such as those pictured at 206 of FIG. 2. Holder 304 is designed to hold a flat or sheet magnet 305, oriented such that the flat magnet is substantially parallel to the printed circuit board and its ground plane. While it is desirable to position the flat magnet housed by holder 304 parallel with the ground plane, for purposes of this application the flat magnet is substantially parallel if it is within 20 degrees of parallel in orientation to a ground plane. In alternate embodiments of the invention, substantially parallel comprises a lesser angle of difference, including 10 degrees and 5 degrees in various embodiments. In still other embodiments of the invention, the angle is greater than 20 degrees.

Figure 4:
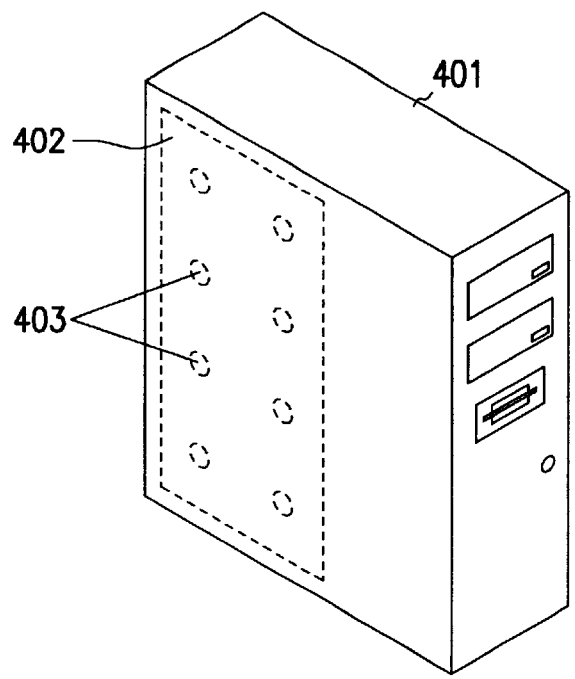
FIG. 4 shows a personal computer as an exemplary reduced electromagnetic emissions digital electronic device, consistent with an embodiment of the present invention.

FIG. 4 illustrates a personal computer as an exemplary reduced electromagnetic emissions digital electronic device, consistent with an embodiment of the present invention. Here, a computer case 401 encloses a motherboard 402, which is mounted to the computer case. Magnets 403 are affixed within the computer in close proximity to the motherboard such that the magnetic flux they produce is operable when current flows through the ground plane of the circuit board to perturb the current path taken through the ground plane. The magnets shown in this embodiment are again disc or cylindrical magnets, and are mounted to the motherboard such as is shown in FIG. 3.

In an alternate embodiment, the case 401 which already serves as an electromagnetic shield further has attached to one wall one or more magnets 403, which are positioned within the case in close proximity to the location at which a motherboard is to be mounted. When a motherboard is mounted to the case and operated, the magnets will be sufficiently close to the printed circuit board to perturb current flow through the ground plane of the circuit board in operation. Such embodiments of the invention provide incorporation of the permanent magnets into a system consistent with the present invention where motherboards don't have provisions such as slots 302 for attachment of magnets directly to the motherboard.

Because the present invention utilizes one or more permanent magnets to cause a perturbation in the return current path taken through a ground plane of a circuit board, it desirably reduces electromagnetic emissions because the perturbed current path is one of higher impedance than the nonperturbed path and consequently has a lower return current. The invention is implemented with various types of magnets in different embodiments, including rare-earth magnets, AlNiCo magnets, Neodymium magnets, and flat-sheet magnets.

The example embodiments of the present invention shown here have illustrated the present invention in the context of a personal computer. Other embodiments of the invention include incorporation of the features illustrated, discussed, and claimed here in other digital electronic devices, including set-top boxes, personal digital assistants (PDAs), audiovisual equipment, monitors and televisions, and any other digital electronic devices consistent with the invention as claimed. Set-top boxes include television-based Internet appliances, cable television service devices, and other television-based computerized systems. PDAs include portable computing systems such as PalmOS™ and Windows CE™ devices, cellular telephones with information handling functions, and other such portable computing devices.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A reduced electromagnetic emission circuit board assembly, comprising:
   a circuit board having at least one ground plane;
   at least one magnet affixed in proximity to said at least one ground plane of die circuit board such that magnetic flux from said at least one magnet is operable to perturb current flow through the ground plane thereby reducing electromagnetic emissions; and
   a conductive circuit board trace configured to carry current a predetermined distance on said circuit board;
   wherein said at least one ground plane is characterized by a first path of low resistance, said first path of low resistance being a first return path associated with the conductive circuit board trace prior to affixing the at least one magnet in proximity to said at least one ground plane; and
   wherein said at least one ground plane is characterized by a second path of low resistance, said second path of low resistance being a second return path associated with the conductive circuit board trace after affixing the at least one magnet in proximity to said at least one ground plane, said second return path having a higher impedance than said first return path due to perturbing the current flow.

2. The reduced electromagnetic emission circuit board assembly of claim 1, wherein said at least one magnet is a permanent rare earth magnet.

3. The reduced electromagnetic emission circuit board assembly of claim 1, wherein said at least one magnet is an alnico magnet, substantially comprising aluminum, nickel, and cobalt.

4. The reduced electromagnetic emission circuit board assembly of claim 1, wherein said at least one magnet substantially comprises neodymium.

5. The reduced electromagnetic emission circuit board assembly of claim 1, wherein said at least one magnet is substantially flat in configuration.

6. The reduced electromagnetic emission circuit board assembly of claim 5, wherein said at least one magnet substantially flat in configuration is oriented parallel to said ground plane.

7. The reduced electromagnetic emission circuit board assembly of claim of claim 1, wherein said second return path is defined by a longer distance through said at least one ground plane than said first return path.

8. The reduced electromagnetic emission circuit board assembly of claim of claim 7, wherein said at least one magnet comprises a plurality of magnets disposed in a plane which is parallel to said at least one ground plane.

9. A reduced electromagnetic emission digital electronic device, comprising:
   a housing;
   a circuit board disposed in said housing and having at least one ground plane;
   at least one magnet affixed in proximity to the at least one ground plane of the circuit board such that magnetic flux of said at least one magnet is operable to perturb current flow through the ground plane upon function of the circuit board and thereby reduce electromagnetic emissions; and
   a conductive circuit board trace disposed on said circuit board, said conductive circuit board trace being configured to carry current a predetermined distance on said circuit board;
   wherein said at least one ground plane is characterized by a first path of low resistance, said first path of low resistance being a first return path associated with the conductive circuit board trace prior to affixing the at least one magnet in proximity to said at least one ground plane;
   wherein said at least one ground plane is characterized by a second path of low resistance, said second path of low resistance being a second return path associated with the conductive circuit board trace after affixing the at least one magnet in proximity to said at least one ground plane, said second return path having a higher impedance than said first return path and being defined by a longer distance trough said at least one ground plane than said first return path due to perturbing the current flow; and
   wherein said at least one magnet comprises a plurality of magnets disposed in a plane which is parallel to said at least one ground plane.

10. The reduced electromagnetic emission digital electronic device of claim 9, wherein said digital electronic device is a computer.

11. The reduced electromagnetic emission digital electronic device of claim 9 wherein said digital electronic device is a set-top box.

12. The reduced electromagnetic emission digital electronic device of claim 9, wherein said digital electronic device is a personal digital assistant (PDA).

13. The reduced electromagnetic emission digital electronic device of claim 9, wherein said at least one magnet is a permanent rare-earth magnet.

14. The reduced electromagnetic emission digital electronic device of claim 9, wherein said at least one magnet is an alnico magnet.

15. The reduced electromagnetic emission digital electronic device of claim 9, wherein said at least one magnet substantially comprises neodymium.

16. The reduced electromagnetic emission digital electronic device of claim 9, wherein the at least one magnet is substantially flat in configuration.

17. The reduced electromagnetic emission digital electronic device of claim 16, wherein the at least one magnet substantially flat in configuration is oriented substantially parallel to the ground plane.

18. A digital electronic device electromagnetic shield, comprising:

an enclosure configured to support and house a printed circuit board; and at least one magnet affixed to the enclosure such that it is in proximity to the printed circuit board, the at least one magnet operable to perturb current flow through the ground plane upon function of the printed circuit board.

19. The digital electronic device electromagnetic shield of claim 18, wherein said enclosure is a computer case, the printed circuit board having attached at least one microprocessor.

20. The digital electronic device electromagnetic shield of claim 18, wherein said at least one magnet is a permanent rare earth magnet.

21. The digital electronic device electromagnetic shield of claim 18, wherein said at least one magnet is an alnico magnet.

22. The digital electronic device electromagnetic shield of claim 18, wherein said at least one magnet substantially comprises neodymium.

23. The digital electronic device electromagnetic shield of claim 18, wherein said at least one magnet is substantially flat in configuration.

24. The digital electronic device electromagnetic shield of claim 18, wherein said at least one magnet substantially flat in configuration is oriented parallel to the ground plane.

* * * * *